United States Patent
Pages et al.

[11] Patent Number: 5,413,952
[45] Date of Patent: May 9, 1995

[54] DIRECT WAFER BONDED STRUCTURE METHOD OF MAKING

[75] Inventors: Irenee Pages, Mesa; Francesco D'Aragona, Scottsdale; James A. Sellers, Tempe; Raymond C. Wells, Scottsdale, all of Ariz.

[73] Assignee: Motorola, Inc., Schaumburg, Ill.

[21] Appl. No.: 190,393

[22] Filed: Feb. 2, 1994

[51] Int. Cl.⁶ .................... H01L 21/265; H01L 21/76
[52] U.S. Cl. ........................... 437/62; 437/86; 437/188; 437/974; 148/DIG. 12
[58] Field of Search ......... 437/86, 21, 62, 974, 437/188; 148/DIG. 12, DIG. 135

[56] References Cited

U.S. PATENT DOCUMENTS

| | | |
|---|---|---|
| 4,839,309 | 6/1989 | Easter et al. |
| 5,089,431 | 2/1992 | Slatter et al. ............ 437/39 |
| 5,102,821 | 4/1992 | Mosliki ................. 437/86 |
| 5,168,078 | 12/1992 | Riesman et al. ......... 437/195 |
| 5,260,233 | 11/1993 | Buti et al. ............. 437/195 |
| 5,268,326 | 12/1993 | Lesk et al. |

FOREIGN PATENT DOCUMENTS

| | | |
|---|---|---|
| 297734 | 1/1992 | German Dem. Rep. ... 148/DIG. 12 |
| 3132055 | 6/1991 | Japan. |
| 4162630 | 6/1992 | Japan. |

OTHER PUBLICATIONS

Haisma et al., Jap. J. Appl. Phys., vol. 28, No. 8, (1989) pp. 1426–1443.

*Primary Examiner*—Olik Chaudhuri
*Assistant Examiner*—Ken Horton
*Attorney, Agent, or Firm*—Joe E. Barbee; Kevin B. Jackson

[57] ABSTRACT

A method for forming a direct wafer bonded structure having a buried high temperature metal nitride layer (16) and improved thermal conductivity is provided. By patterning the high temperature metal nitride layer (16) with a non-oxidizing photoresist stripper and absent a photoresist hardening step, adhesion between the high temperature metal nitride layer (16) and a dielectric layer (17, 27) subsequently formed over the high temperature metal nitride layer (16) is significantly improved. The dielectric layer (17, 27) will adhere to the high temperature metal nitride layer (16) in high temperature environments. In addition, a direct wafer bonded structure having a buried high temperature metal nitride layer (16) and improved thermal conductivity is provided. The structure is suitable for power, logic, and high frequency integrated circuit devices.

19 Claims, 5 Drawing Sheets

5,413,952

DIRECT WAFER BONDED STRUCTURE METHOD OF MAKING

BACKGROUND OF THE INVENTION

This invention relates, in general, to the fabrication of a semiconductor structure, and more particularly, to the fabrication of a direct wafer bonded structure.

The direct wafer bonding of one semiconductor substrate to an insulating substrate or to an insulating layer formed on a semiconductor substrate has been reported in the past. Such structures are often called semiconductor-on-insulator (SOI) or dielectrically isolated direct wafer bonded structures. Typically, these direct wafer bonded structures use buried layers comprising diffused dopants or doped polysilicon. However, these buried layers have a disadvantage in that they have sheet resistance values on the order of 20 ohms/square. High sheet resistance values cause long RC time constants and hence undesirably long time delays. As a result, buried layers comprising high temperature metal nitrides such as titanium-nitride, vanadium-nitride, and tungsten-nitride are desirable because they have sheet resistance values on the order of 10 ohms/square and they are stable at temperatures in excess of 1100° C.

However, when a patterned high temperature metal nitride layer is used for a buried layer, significant adhesion problems occur between the high temperature metal nitride layer and a dielectric layer formed over the high temperature metal nitride layer. This is particularly true when the layers are subsequently subjected to high temperature. Poor adhesion negatively impacts bonded wafer yield and device reliability. The direct wafer bonding process requires high temperature processing after the dielectric layer is formed over a high temperature metal nitride layer. Thus, there exists a need for a process for forming a dielectric layer over a high temperature metal nitride layer that provides good adhesion between the layers when the layers are subjected to high temperature.

Furthermore, direct wafer bonded structures often incorporate thick dielectric layers having low thermal conductivities between the bonded substrates. Thick dielectric layers that have low thermal conductivities result in poor thermal dissipation, which complicates the large scale integration of logic devices and power devices. Thus, there also exists a need for a direct wafer bonded structure that has good thermal conductivity.

SUMMARY OF THE INVENTION

Briefly stated, a method for forming a direct wafer bonded structure is provided. A patterned high temperature metal nitride layer is formed on a first surface of an active substrate. A photoresist layer used to pattern the high temperature metal nitride layer is removed using a non-oxidizing photoresist stripper. An interlayer is formed on the high temperature metal nitride layer and a portion of the first surface, wherein the interlayer adheres to the high temperature metal nitride layer during subsequent high temperature environments. The interlayer is annealed to reduce stresses in the interlayer, is planarized, and is bonded to a handle substrate. The interlayer electrically isolates the high temperature metal nitride layer from the handle substrate.

A structure is also provided. The structure has an active substrate of a first conductivity type. A high temperature metal nitride buried layer is located on a portion of a first surface of the active substrate. An interlayer covers the high temperature metal nitride layer and a portion of the first surface. The interlayer is planarized and adheres to the high temperature metal nitride layer under high temperature conditions. A handle substrate is bonded to the interlayer, wherein the interlayer electrically isolates the high temperature metal nitride layer from the handle substrate.

DETAILED DESCRIPTION OF THE DRAWINGS

Figure 1:
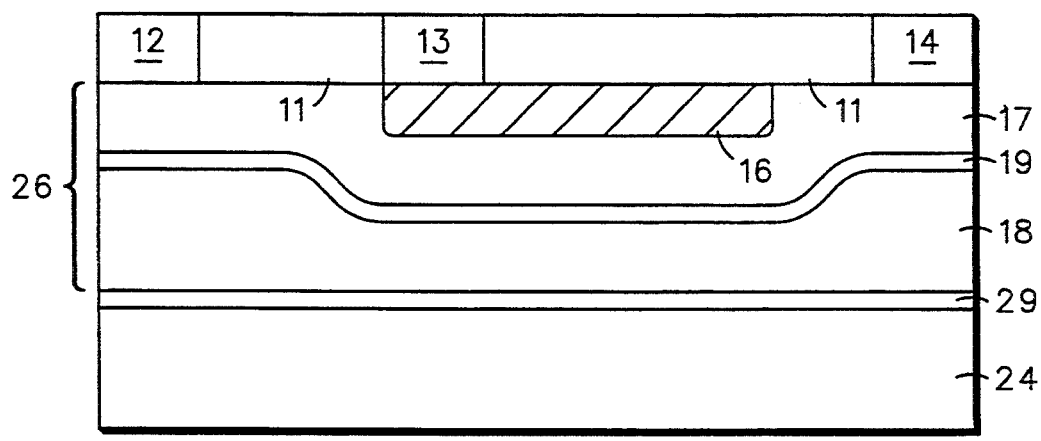
FIG. 1 illustrates an enlarged, cross-sectional view of a first embodiment according to the present invention.

Generally, the present invention provides a method for fabricating a direct wafer bonded structure having a high temperature metal nitride buried layer. The present invention can be more fully described with reference to FIGS. 1–14. FIG. 1 is an enlarged cross-sectional view of one embodiment of a direct wafer bonded structure according to the present invention. The direct wafer bonded structure comprises active substrate 11, buried high temperature metal nitride layer 16 formed on a first surface of active substrate 11, interlayer 26, which comprises dielectric layer 17 and polycrystalline semiconductor layers 18 and 19 in a first embodiment, and handle substrate 24. Preferably, dielectric layer 29 is formed on handle substrate 29 prior to wafer bonding. In a preferred embodiment, active substrate 11 comprises heavily doped regions 12 and 14, which form isolation regions, and heavily doped region 13, which forms a contact region.

To fabricate the direct wafer bonded substrate shown in FIG. 1, experimentation showed that in order to provide good adhesion between high temperature metal nitride layer 16 and dielectric layer 17, high temperature metal nitride layer 16 is processed in a non-oxidizing environment prior to the deposition of dielectric layer 17. It was found that surface oxidation, among other things, of high temperature metal nitride layer 16 prior to the deposition of dielectric layer 17 greatly reduces the adhesion between the two layers, particularly when the two layers are subsequently exposed to high temperature, such as a high temperature direct wafer bonding process.

Figure 2:
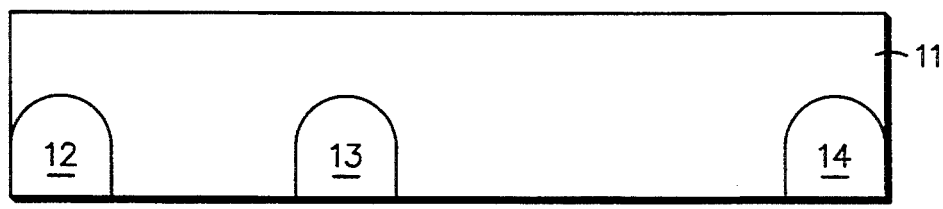
FIGS. 2–10 illustrate enlarged, cross-sectional views of the embodiment of FIG. 1 at various stages of fabrication.

In a preferred embodiment for processing high temperature metal nitride layer 16 in a non-oxidizing environment prior to the deposition of dielectric layer 17, FIG. 2 shows an enlarged cross-sectional view of active substrate 11 at an early stage of fabrication. Substrate 11 comprises a semiconductor material of a first conductivity type and a first and second surface. Preferably, substrate 11 has localized heavily doped regions 12, 13 and 14 extending from the first surface. Preferably, substrate 11 is comprised of silicon and is doped with a n-type dopant, such as phosphorus, with a dopant concentration on the order of $1.0 \times 10^{15}$ to $3.0 \times 10^{16}$ atoms/cm$^3$. Preferably, substrate 11 is of a <100> crystal orientation.

Heavily doped regions 12, 13, and 14 are formed using standard doping techniques. Preferably, doped region 13 is of the same conductivity type as substrate 11 and doped regions 12 and 14 are of a second conductivity type that is different than the conductivity type of doped region 13 and substrate 11. In the preferred embodiment, doped region 13 is doped with phosphorus and has a surface concentration of at least $6.5 \times 10^{19}$ atoms/cm$^3$ at the first surface and has a junction depth on the order of 5 to 10 microns. Doped regions 12 and 14 are doped with a p-type dopant such as boron and have a surface concentration of at least $3.0 \times 10^{19}$ atoms/cm$^3$ and have junction depths on the order of 5 to 10 microns. Preferably, an enhancement layer is formed on the first surface of active substrate 11 to provide a low electrical resistance ohmic contact between active substrate 11 and high temperature metal nitride layer 16. The enhancement layer preferably is formed in a pattern corresponding to the pattern of high temperature metal nitride layer 16. The enhancement layer preferably has a surface concentration greater than $1.0 \times 10^{19}$ atom/cm$^3$. Ion implantation may be used to form the enhancement layer although other doping techniques also may be used.

As shown in FIG. 1, after final processing, doped region 13 will form a contact region to buried high temperature metal nitride layer 16, and doped regions 12 and 14 form isolation regions for active substrate 11. To provide isolation for substrate 11, doped isolation, such as doped regions 12 and 14, is the preferred method of isolation, but other forms of isolation may be used.

Figure 3:
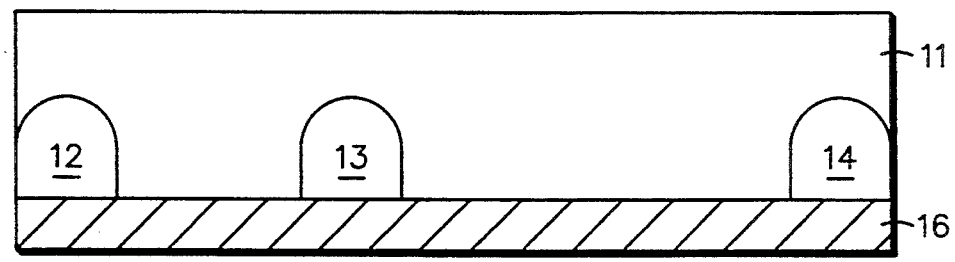

FIG. 3 shows substrate 11 at a later step in fabrication. High temperature metal nitride layer 16 is formed over the first surface of substrate 11. Preferably, high temperature metal nitride layer 16 comprises titanium-nitride, vanadium-nitride, or tungsten-nitride. In the most preferred embodiment, high temperature metal nitride layer 16 comprises titanium-nitride. Methods for forming high temperature metal nitride layer 16 are well known in the art using techniques such as sputtering a high temperature metal in the presence of nitrogen, reactive evaporation, thermal nitration of a pure high temperature metal, and chemical vapor deposition for example. Preferably, when high temperature metal nitride layer 16 comprises titanium-nitride, it has a thickness on the order of 1000 to 3000 angstroms, and a sheet resistance on the order of 4 to 7 ohms/square. After exposure to an elevated temperature, such as the wafer bonding temperature, titanium-nitride having thickness on the order of 1000 to 3000 angstroms has a sheet resistance on the order of 1 to 2 ohms/square.

Figure 4:
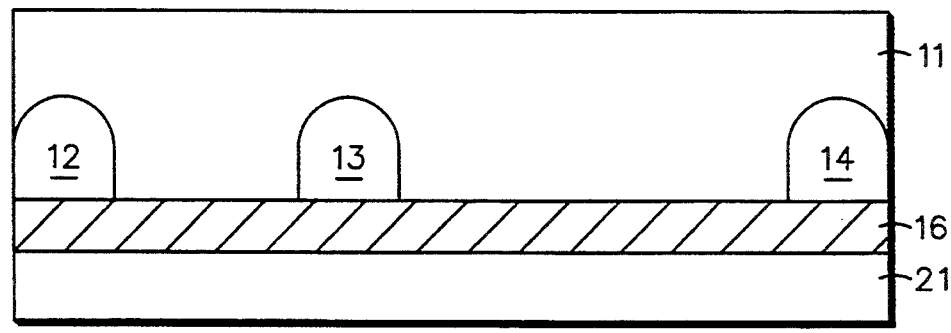

FIG. 4 shows substrate 11 at a further stage of fabrication. Photoresist layer 21 is deposited onto high temperature metal nitride layer 16 using standard photoresist dispensing techniques. Preferably, photoresist layer 21 is a positive photoresist such as JSR 500, available from Japan Synthetic Rubber Company. After photoresist layer 21 is deposited, photoresist layer 21 is soft baked at a low temperature to dehydrate and remove excess solvents. Next, photoresist layer 21 is selectively exposed to light using a photomask.

Figure 5:
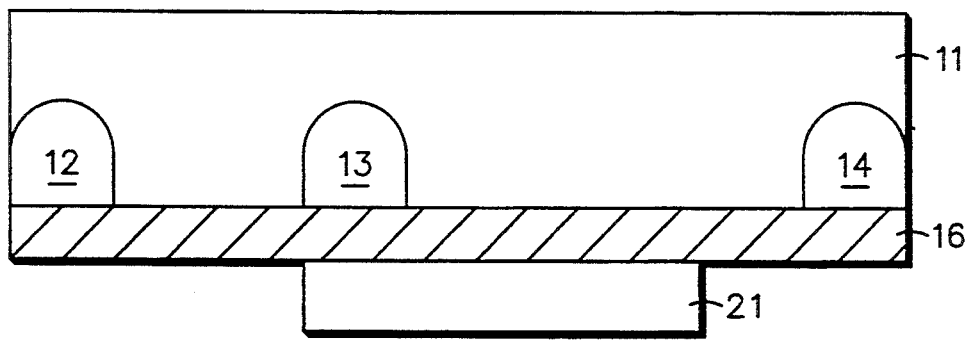

As shown in FIG. 5, after exposure, photoresist layer 21 is developed in order to selectively remove photoresist layer 21 to form a desired pattern. To develop positive photoresist, a pH basic non-metal ion containing developer such as tetra-methyl ammonium hydroxide is used. Such a developer is available from Shipley Corporation. After development, photoresist layer 21 preferably is not subjected to a hardening process, such as a deep UV radiation or a low energy inert gas plasma, in order to prevent excessive hardening of the photoresist. Experimentation showed that a photoresist hardening process results in residual photoresist remaining on high temperature metal nitride layer 16, particularly around the periphery of substrate 11, after removing remaining photoresist layer 21. This is particularly true when a wet photoresist stripper is used as opposed to a dry photoresist stripper. It was found that residual photoresist contributes to adhesion problems between high temperature metal nitride layer 16 and dielectric layer 17, particularly when the layers are subsequently exposed to high temperature. If photoresist reworking of high temperature metal nitride layer 16 is necessary, the non-oxidizing photoresist stripper is used to prevent subsequent adhesion problems.

Figure 6:
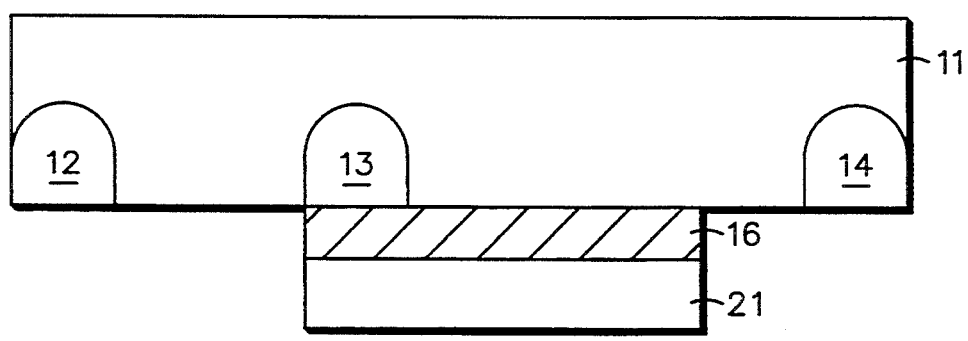

Next, as shown in FIG. 6, high temperature metal nitride layer 16 is etched to conform to the pattern provided by remaining photoresist layer 21. High temperature metal nitride layer 16 is etched using a reactive ion etch system with a chlorine based chemistry for example. However, to prevent unwanted doping, it is preferred that high temperature metal nitride layer 16 is not etched using BCl$_3$. It was found that when using BCl$_3$ to etch high temperature metal nitride layer 16, residual BCl$_3$ remains on etched surfaces unprotected by photoresist layer 21. The residual BCl$_3$ provides a potential dopant source for boron to diffuse into substrate 11 during subsequent high temperature processing, thus forming unwanted p-type regions.

Figure 7:
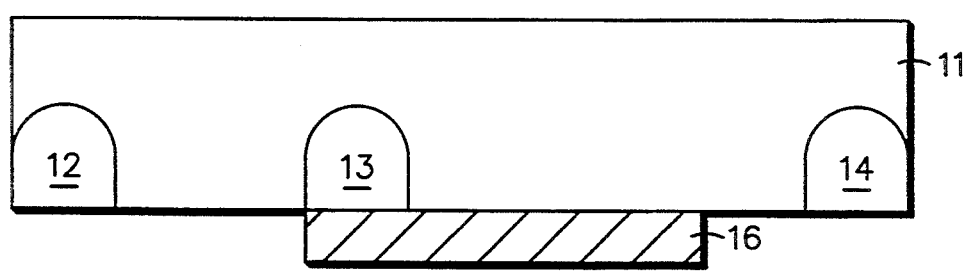

As shown in FIG. 7, after high temperature metal nitride layer 16 is etched, remaining photoresist layer 21 is removed using a non-oxidizing photoresist stripper to avoid surface oxidation of high temperature metal nitride layer 16. When photoresist layer 21 comprises a positive photoresist, a non-oxidizing photoresist stripper comprising n-methyl pyrrolidone (NMP) having a basic pH is used for example. An example of such a stripper is Posistrip™, which is available from EKC Technologies of Hayward, Calif.

To prevent surface oxidation of high temperature metal nitride layer 16 and subsequent adhesion problems, remaining photoresist layer 21 is not removed using a dry oxidation based photoresist removal method such as oxygen plasma. Experimentation showed that if any dry oxidation based photoresist removal methods are used to remove photoresist layer 21 formed over high temperature metal nitride layer 16, adhesion problems result between high temperature metal nitride layer 16 and a dielectric layer formed subsequently on high temperature metal nitride layer 16. Excessive surface oxidation of high temperature metal nitride layer 16, which results from dry oxidation based photoresist removal methods, was found to be a significant contributor to adhesion problems.

To remove photoresist layer 21, two baths containing the NMP preferably are used in a serial manner. The first bath is preferably recirculated and filtered and is maintained at approximately 75° to 85° C. Substrate 11 having photoresist layer 21 is exposed to NMP in the first bath for approximately 15 minutes. The second bath is preferably maintained at approximately 45° to 55° C. and serves to remove any residual photoresist layer 21. Substrate 11 is exposed to NMP in the second bath for approximately 5 minutes. Following the second NMP bath, substrate 11 is rinsed using de-ionized water and dried using conventional rinser/dryer technology.

Figure 14:
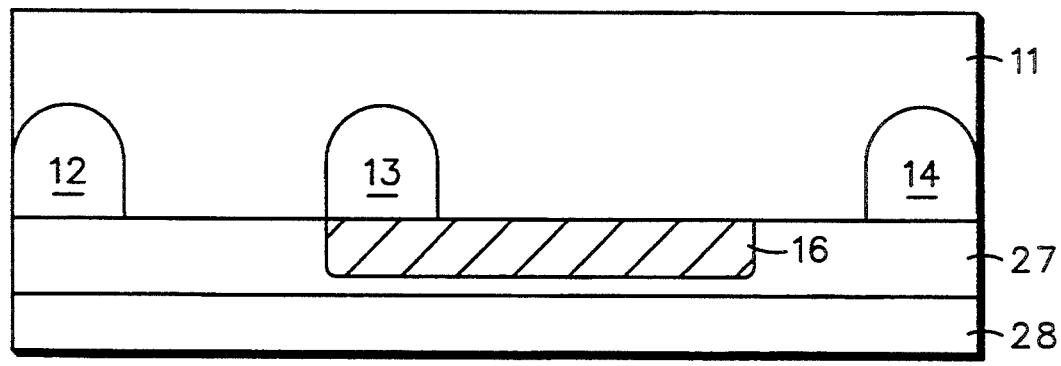
Figure 15:
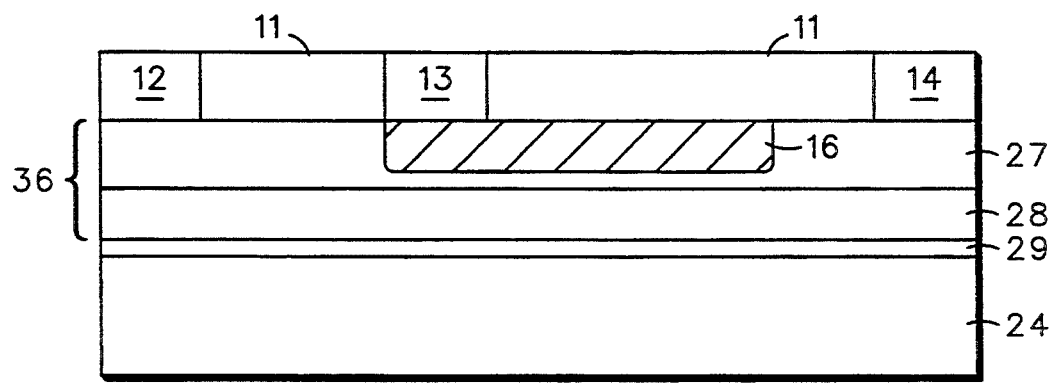
FIG. 15 illustrates an enlarged, cross-sectional view of the second embodiment according to the present invention.

At this point in the process, substrate 11 is further processed according to the first embodiment having interlayer 26 as shown in FIG. 1, a second embodiment having an interlayer 36 as shown in FIG. 14, or a third embodiment having an interlayer 46 as shown in FIG. 15. In the first embodiment, interlayer 26 comprises dielectric layer 17 and polycrystalline semiconductor layers 18 and 19. In the second embodiment, interlayer 36 comprises first and second dielectric layers 27 and 28. In the third embodiment, interlayer 46 comprises a single layer of dielectric material.

Figure 8:
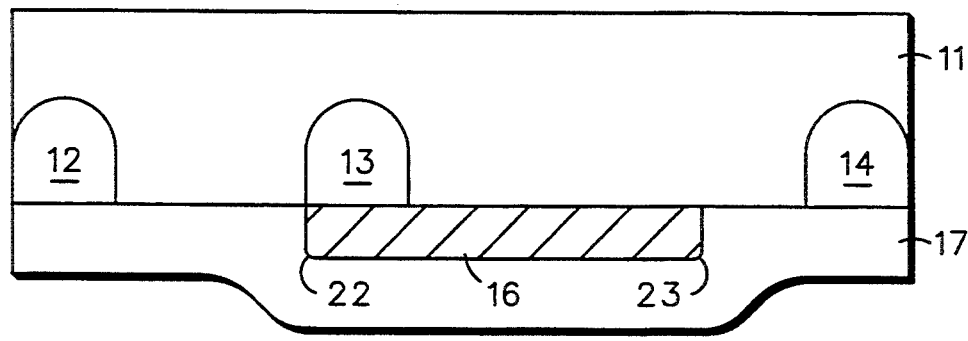

In the first embodiment and as shown in FIG. 8, dielectric layer 17 is formed over high temperature metal nitride layer 16 and a portion of the first surface of active substrate 11. Dielectric layer 17 functions as an electrical isolation means over high temperature metal nitride layer 16. Dielectric layer 17 comprises silicon oxide, silicon nitride, silicon oxynitride, phosphosilicate glass (PSG), or borophosphosilicate glass (BPSG). In applications where good thermal dissipation is necessary, dielectric layer 17 may comprise silicon carbide, diamond-like carbon, boron nitride, beryllium oxide, or the like. In the preferred embodiment, dielectric layer 17 comprises silicon oxide deposited using plasma-enhanced (PE) chemical vapor deposition from tetraethylorthosilicate (TEOS), commonly referred to as plasma-enhanced tetraethylorthorsilicate (PETEOS). Preferably, dielectric layer 17 is deposited at approximately 400° C. with a growth rate of approximately 125 to 145 angstroms/second. PETEOS silicon oxide was found to provide the best adhesion to high temperature metal nitride layer 16 during subsequent high temperature processing. Preferably, dielectric layer 17 is on the order of 4000 to 6000 angstroms thick.

After deposition, dielectric layer 17 preferably is annealed to remove stresses in dielectric layer 17, particularly stresses localized over edges 22 and 23 of high temperature metal nitride layer 16. In addition, when dielectric layer 17 comprises PETEOS, the anneal step serves to densify and stabilize it for further high temperature processing. Preferably, when dielectric layer 17 comprises PETEOS, it is annealed at approximately 1000° C. in an inert gas such as $N_2$ for approximately 60 minutes. The oxygen concentration in the anneal process preferably is less than approximately 3000 ppm to prevent oxidation by diffusion of high temperature metal nitride layer 16.

Figure 9:
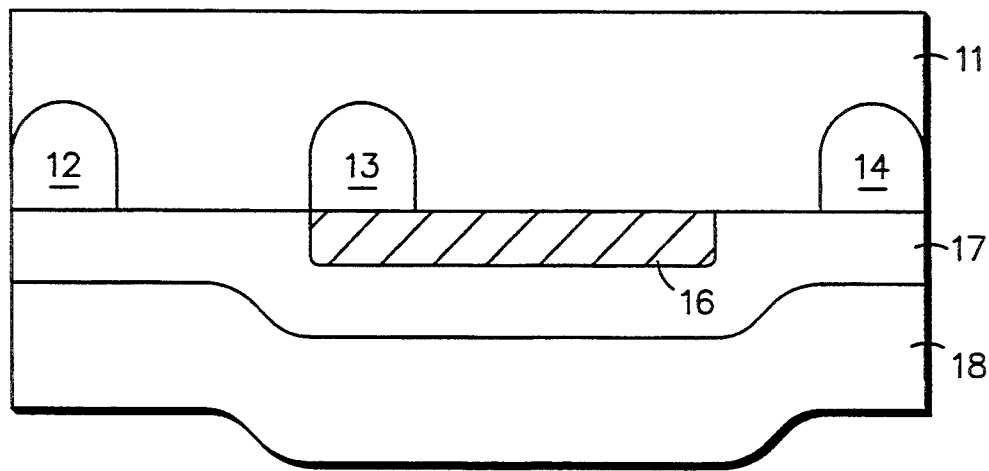

Next, as shown in FIG. 9, a first polycrystalline semiconductor layer 18 is deposited on dielectric layer 17. First polycrystalline semiconductor layer 18 serves as a planarizing medium to compensate for the topography of underlying dielectric layer 17 and high temperature metal nitride layer 16. First polycrystalline semiconductor layer 18 preferably is undoped polysilicon deposited using epitaxial-polysilicon growth and is on the order of 15 to 25 microns thick. Preferably, first polycrystalline semiconductor layer 18 is deposited using trichlorosilane at approximately 1150° C. with a growth rate of approximately 1.0 micron/minute.

Figure 10:
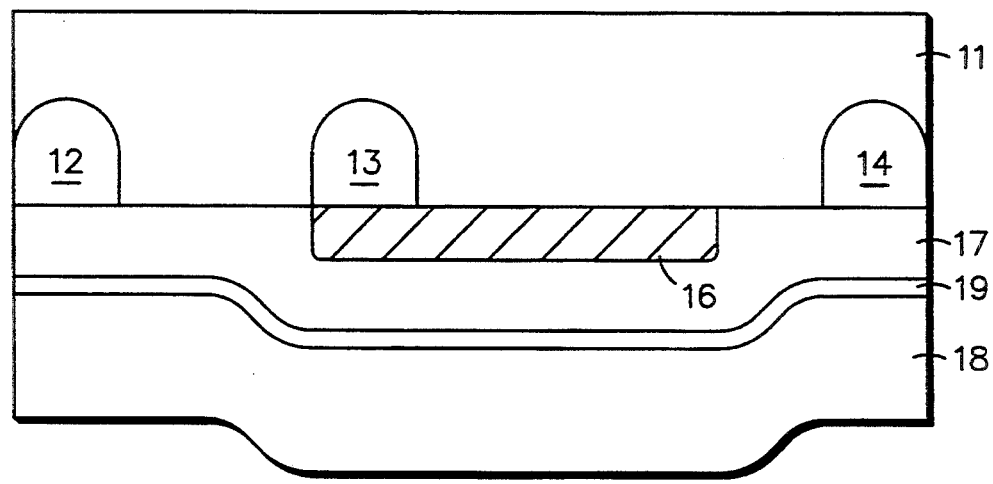

In a preferred embodiment and as shown in FIG. 10, a second polycrystalline layer 19 is deposited on dielectric layer 17 prior to depositing first polycrystalline semiconductor layer 18. Second polycrystalline semiconductor layer 19 provides a seed layer that promotes a more uniform deposition of first polycrystalline semiconductor layer 18. Second polycrystalline semiconductor layer 19 preferably is undoped polysilicon deposited using low pressure chemical vapor deposition (LPCVD), and is on the order of 500 to 1000 angstroms thick. Preferably, second polycrystalline semiconductor layer 19 is deposited using a silane at approximately 630° C. with a growth rate of approximately 100 angstroms/minute.

Figure 11:
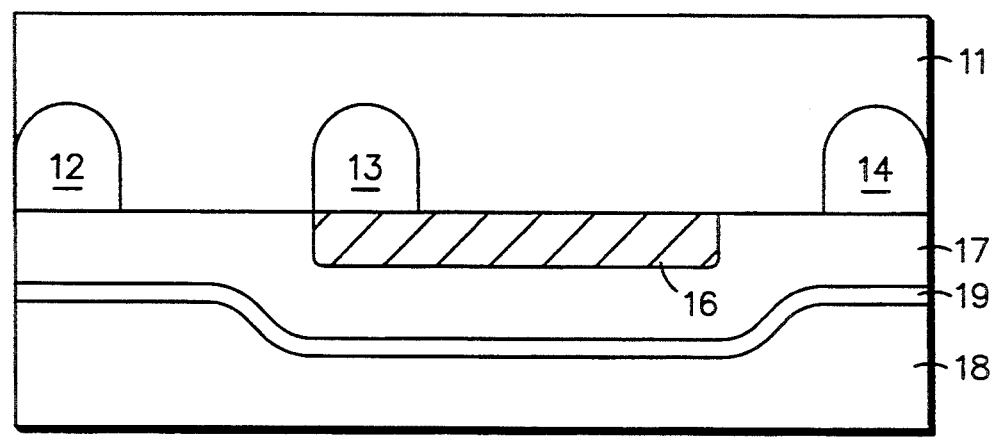
FIGS. 11–14 illustrate enlarged, cross-sectional views of a second embodiment according to the present invention at various stages of fabrication.

Next, as shown in FIG. 11, first polycrystalline semiconductor layer 18 is planarized. First polycrystalline semiconductor layer 18 is planarized using a two step process comprising a grinding step and a polishing step. First, approximately 5 to 10 microns of polycrystalline semiconductor material from first polycrystalline semiconductor layer 18 is removed using a conventional grinding process with a removal rate of approximately 60 microns/minute. Second, approximately 5 additional microns of first polycrystalline semiconductor layer 18 are removed using a conventional polishing process with a removal rate of approximately 1.0 microns/minute. After planarization, polycrystalline semiconductor material on the order of 5 to 10 microns thick is left on dielectric layer 17.

Optionally, first polycrystalline semiconductor layer 18 is processed through an edge grind process before the first grinding step in order to remove excess polycrystalline semiconductor material around the outer edges of first polycrystalline semiconductor layer 18. After polishing, substrate 11 is cleaned using for example, a piranha etch followed by a hydrofluoric acid etch, a hot nitric acid etch, and a scrub, to remove contamination from the surface of first polycrystalline semiconductor layer 18. Dielectric layer 17 and polycrystalline semiconductor layers 18 and 19 form interlayer 26 in the first embodiment. The first embodiment is now ready for direct wafer bonding to form the structure shown in FIG. 1. The direct wafer bonding process is discussed below.

Figure 12:
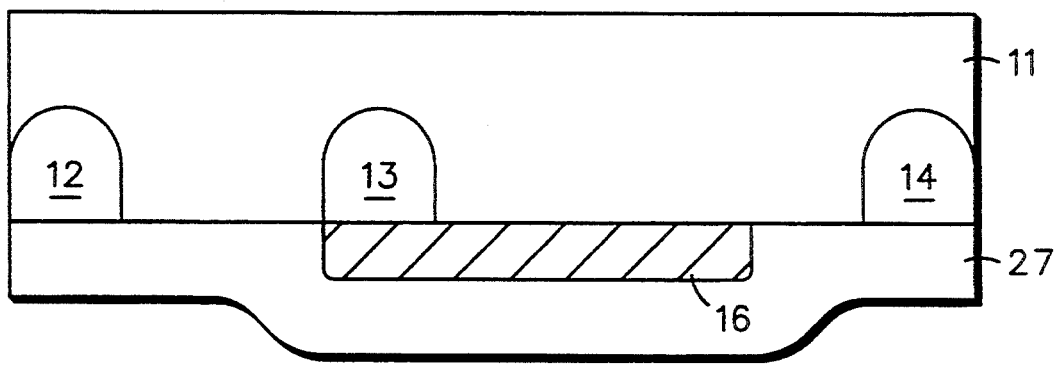

In the second embodiment, as shown in FIG. 12, dielectric layer 27 is deposited having a thickness of approximately 10,000 to 20,000 angstroms to provide both an electrical isolation and a planarizable medium to compensate for the topography of high temperature metal nitride layer 16. Dielectric layer 27 comprises silicon oxide, silicon nitride, silicon oxynitride, PSG, or BPSG. In applications where good thermal dissipation is necessary, dielectric layer 27 may comprise silicon carbide, diamond-like carbon, boron nitride, beryllium oxide, or the like. Preferably, dielectric layer 27 comprises PETEOS silicon oxide and is deposited at approximately 400° C. with a growth rate of approximately 125 to 145 angstroms/second. PETEOS silicon oxide was found to provide the best adhesion to high temperature metal nitride layer 16 during subsequent high temperature processing, particularly when high temperature metal nitride layer 16 comprises titanium-nitride.

After deposition, dielectric layer 27 preferably is annealed to remove stresses in dielectric layer 27. In addition, when dielectric layer 27 comprises PETEOS, the anneal step serves to densify and stabilize it for further high temperature processing. Preferably, when dielectric layer 27 comprises PETEOS, it is annealed at approximately 1000° C. in an inert gas such as $N_2$ for approximately 60 minutes. The oxygen concentration in the anneal process preferably is less than approximately 3000 ppm to prevent oxidation by diffusion of high temperature metal nitride layer 16.

Figure 13:
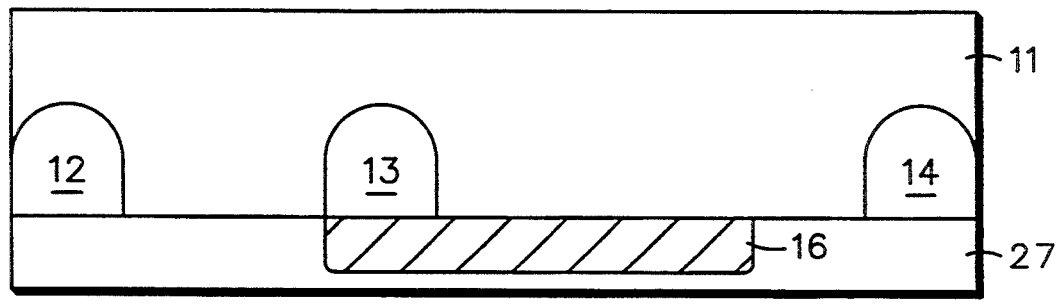

Next, as shown in FIG. 13, dielectric layer 27 is planarized using, for example, a chemical-mechanical polishing (CMP) process with a dielectric removal target of approximately 2,000 to 12,000 angstroms, depending on the thickness of the underlying topography, thereby leaving approximately 8,000 angstroms of dielectric. A dielectric removal rate of 3,000 angstroms/minute is used for example. After CMP planarization, the exposed surface of dielectric layer 27 preferably is mechanically cleaned using a secondary polishing pad absent polishing slurry to remove any residual cerium oxide slurry present on the surface of dielectric layer 27.

It was found that when a cerium oxide abrasive is used in the form of a slurry with aqueous sodium hydroxide or ammonium hydroxide for planarization of dielectric layer 27, clusters of cerium oxide residues remained on the exposed surface of dielectric layer 27 following de-ionized water rinsing. The cerium oxide residues form unwanted micro-masks on the exposed surface of dielectric layer 27, which cause non-uniform etching or roughening of the exposed surface during subsequent wet cleaning steps that use hydrofluoric acid for example. The non-uniformly etched exposed surface of dielectric layer 27 results in poor bonding to handle substrate 24. Also, residual cerium oxide residues were found to outgas during wafer bonding resulting in large void formation. These problems were resolved by using the secondary polishing pad absent slurry containing cerium oxide to completely remove any residual cerium oxide from the exposed surface of dielectric layer 27 before additional cleaning.

Next, as shown in FIG. 14, a second dielectric layer 28 is deposited on dielectric layer 27 at a thickness of approximately 5,000 to 15,000 angstroms to restore the overall thickness of the dielectric to approximately 10,000 to 20,000 angstroms to provide good electrical isolation and to provide a clean surface for the wafer bonding process. Dielectric layer 28 may comprise silicon oxide, silicon nitride, silicon oxynitride, PSG, or BPSG. In applications where good thermal dissipation is necessary, dielectric layer 28 may comprise silicon carbide, diamond-like carbon, boron nitride, beryllium oxide, or the like.

Dielectric layer 28 preferably is PETEOS silicon oxide deposited under similar conditions to dielectric layer 27. After deposition, dielectric 28 is annealed to densify the PETEOS. In addition, it was found that this anneal step provides a more consistent bond between dielectric layer 28 and handle substrate 24 during the direct wafer bonding process. Preferably, dielectric layer 28 is annealed in an inert gas, such as $N_2$, at approximately 1000° C. for approximately 60 minutes. The oxygen concentration in the anneal process is less than approximately 3000 ppm to prevent oxidation by diffusion of high temperature metal nitride layer 16. Dielectric layers 27 and 28 form interlayer 36 in the second embodiment. The second embodiment is now ready for direct wafer bonding to form the structure shown in FIG. 15. The direct wafer bonding process is discussed below.

Figure 16:
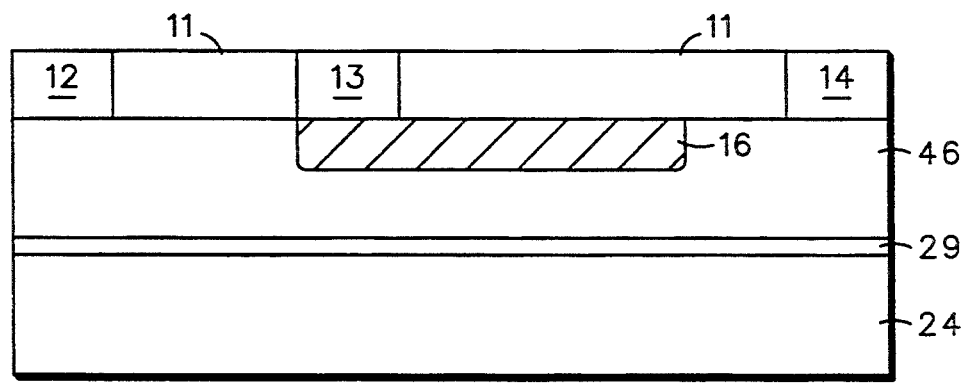
FIG. 16 illustrates an enlarged, cross-sectional view of a third embodiment according to the present invention.

In the third embodiment shown in FIG. 16, interlayer 46 is deposited over high temperature metal nitride layer 16 and a portion of the first surface of active substrate 11. Interlayer 46 has thickness on the order of 15,000 to 35,000 angstroms for example and provides electrical isolation and a planarizable medium to compensate for the topography of high temperature metal nitride layer 16. Interlayer 46 comprises silicon oxide, silicon nitride, silicon oxynitride, PSG, or BPSG. In applications where good thermal dissipation is necessary, interlayer may comprise silicon carbide, diamond-like carbon, boron nitride, beryllium oxide, or the like.

Interlayer 46 preferably is PETEOS silicon oxide deposited at approximately 400° C. with a growth rate of approximately 125 to 145 angstroms/second. PETEOS was found to provide the best adhesion to high temperature metal nitride layer 16 during subsequent high temperature processing, particularly when high temperature metal nitride layer 16 comprises titanium-nitride.

After interlayer 46 is deposited, interlayer 46 is planarized. Interlayer 46 is planarized using, for example, a chemical-mechanical polishing (CMP) process with a removal target of approximately 5,000 to 15,000 angstroms, depending on the thickness of the underlying topography. A removal rate of 3,000 angstroms/minute is used for example. After CMP planarization, the exposed surface of interlayer 46 preferably is mechanically cleaned using a secondary polishing pad absent polishing slurry to remove any residual cerium oxide slurry present on the surface of interlayer.

Next, interlayer 46 is annealed to densify the dielectric material and to reduce stresses in interlayer 46. In addition, it was found that this anneal step provides a more consistent bond between interlayer 46 and handle substrate 24 during the direct wafer bonding process. Preferably, when interlayer 46 comprises PETEOS silicon oxide, it is annealed in an inert gas, such as $N_2$, at approximately 1000° C. for approximately 60 minutes. The oxygen concentration in the anneal process is less than approximately 3000 ppm to prevent oxidation by diffusion of high temperature metal nitride layer 16. Optionally, interlayer 46 is annealed prior to and after planarization. The third embodiment is now ready for direct wafer bonding to form the structure shown in FIG. 16.

For direct wafer bonding of the three embodiments, handle substrate 24 is physically joined to first polycrystalline semiconductor layer 18 in the first embodiment, or physically joined to dielectric layer 28 in the second embodiment, or physically joined to interlayer 46 in the third embodiment and heated so that a strong bond is formed between them. Handle substrate 24 may comprise a single crystal or a polycrystalline semiconductor material. Preferably, a dielectric layer 29 is formed on a surface of handle substrate 24 prior to the wafer bonding step as shown in FIGS. 1, 15 and 16. Dielectric layer 29 comprises a silicon oxide or a high thermal conductivity dielectric for example.

Preferably, the wafer bonding process is carried out at 1050° to 1250° C. for approximately 50 to 70 minutes in a steam ambient. During this bonding process, doped regions 12, 13, and 14 diffuse farther into substrate 11. After wafer bonding, a portion of substrate 11 preferably is removed from the second surface of substrate 11 to provide the direct wafer bonded structures shown in FIGS. 1, 15, and 16. Optionally, active substrate 11 is not thinned and devices are fabricated on active substrate 11 using the original thickness of active substrate 11. When active substrate 11 is not thinned, additional process steps are necessary to provide isolation for active substrate 11 and to provide contact to high temperature metal nitride layer 16.

Preferably, substrate 11 is thinned until approximately 5 to 15 microns thickness are left. This thinning is accomplished by first grinding and then polishing the second surface of substrate 11 to the desired thickness. After polishing, the second surface of substrate 11 is cleaned using for example, a piranha etch followed by a hydrofluoric acid etch, a hot nitric acid etch, and a scrub, to remove any contamination. The direct wafer bonded structures shown in FIGS. 1, 15, and 16 are now ready for subsequent processing. For example, power, logic, and/or high frequency devices can be fabricated individually or together on the direct wafer bonded structures.

In power device applications, thermal dissipation considerations become important. A power device generates substantial heat and this heat must be effectively removed from the active area of the power device in order for it to operate reliably. Conduction is one process by which heat is removed from power devices. For power device applications or when good thermal dissipation is necessary, it is preferred that dielectric layer 17 in the first embodiment, dielectric layers 27 and 28 in the second embodiment, and interlayer 46 in the third embodiment comprise silicon carbide, diamond-like carbon, boron nitride, beryllium oxide or the like. These materials have higher thermal conductivities compared to other dielectrics such as silicon oxide.

When dielectric layer 17, dielectric layers 27 and 28, and interlayer 46 comprise PETEOS silicon oxide, the first embodiment shown in FIG. 1 is preferred for providing good thermal dissipation because dielectric layer 17 is thinner than dielectric layers 27 and 28 in the second embodiment and interlayer 46 in the third embodiment. This thinner dielectric together with polycrystalline semiconductor material layers 18 and 19, when layers 18 and 19 comprise polysilicon, provides good thermal dissipation characteristics without sacrificing dielectric isolation. Good thermal dissipation allows for the large scale integration of logic devices, which are heat sensitive, with power devices, which generate heat.

By now it should be appreciated that there has been provided a method for forming a direct wafer bonded structure having a high temperature metal nitride buried layer. By processing the photoresist layer used to pattern the high temperature metal nitride layer without a photoresist hardening step and by removing the photoresist layer used to pattern the high temperature metal nitride layer with a non-oxidizing photoresist stripper, adhesion between the high temperature metal nitride layer and an interlayer subsequently formed over the high temperature metal nitride layer is significantly improved. The interlayer will adhere to the high temperature metal nitride layer even during exposure to subsequent high temperature environments.

A direct wafer bonded structure is also provided. The direct wafer bonded structure provides a low sheet resistance buried layer and is suitable for power, logic, and high frequency devices. Furthermore, when the interlayer comprises a thin dielectric layer and a polysilicon layer or a high thermal conductivity dielectric, enhanced thermal conductivity is achieved allowing for large scale integration of logic and power devices.

We claim:

1. A method for making a direct wafer bonded structure comprising the steps of:
   providing an active substrate of a first conductivity type having a first and second surface;
   forming a high temperature metal nitride layer on the first surface of the active substrate;
   depositing a photoresist layer on the high temperature metal nitride layer;
   selectively exposing the photoresist layer to light;
   developing the photoresist layer to selectively remove photoresist to form a pattern;
   etching the high temperature metal nitride layer to conform the high temperature metal nitride layer to the pattern of the photoresist layer;
   removing the remaining photoresist layer using a non-oxidizing photoresist stripper;
   forming an interlayer on the high temperature metal nitride layer and a portion of the first surface, wherein the interlayer adheres to the high temperature metal nitride layer during subsequent high temperature environments;
   annealing the interlayer;
   planarizing the interlayer; and
   bonding a handle substrate to the interlayer wherein the interlayer electrically isolates the active substrate and the high temperature metal nitride layer from the handle substrate.

2. The method of claim 1 wherein the step of forming a high temperature metal nitride layer on the first surface comprises forming a metal nitride layer on the first surface, wherein the metal nitride layer is selected from the group consisting of titanium-nitride, vanadium-nitride, and tungsten nitride; and wherein the step of forming the interlayer on the high temperature metal nitride layer and a portion of the first surface comprises forming a dielectric layer over the high temperature metal nitride layer and a portion of the first surface, and forming a first polycrystalline semiconductor layer on the dielectric layer; and wherein the step of annealing the interlayer comprises annealing the dielectric layer to reduce stresses in the dielectric layer before the step of forming the first polycrystalline semiconductor layer; and wherein the step of planarizing the interlayer comprises planarizing the first polycrystalline semiconductor layer.

3. The method of claim 2 wherein the step of forming the interlayer on the high temperature metal nitride layer and a portion of the first surface further comprises forming a second polycrystalline semiconductor layer on the dielectric layer before the step of forming the first polycrystalline semiconductor layer wherein the second polycrystalline semiconductor layer has a thickness substantially thinner than thickness of the first polycrystalline semiconductor layer.

4. The method of claim 1 wherein the step of forming the interlayer comprises the steps of:
   forming a PETEOS silicon oxide layer over the high temperature metal nitride layer and a portion of the first surface of the active substrate having a thickness on the order of 4000 to 6000 angstroms;
   forming a first polysilicon layer over the PETEOS layer having a thickness on the order of 500 to 1000 angstroms thick;
   forming a second polysilicon layer over the first polysilicon layer having a thickness on the order of 15 to 25 microns thick; and
   wherein the step of annealing the interlayer comprises the step of annealing the PETEOS silicon oxide layer at approximately 1000° C. in an inert ambient having less than 3000 ppm of oxygen to prevent oxidation of the high temperature metal nitride layer.

5. The method of claim 1 wherein the step of forming a high temperature metal nitride layer on the first surface comprises forming a metal nitride layer on the first surface, wherein the metal nitride layer is selected from the group consisting of titanium-nitride, vanadium-nitride, and tungsten nitride; and wherein the step of forming the interlayer on the high temperature metal nitride layer and a portion of the first surface comprises forming a first dielectric layer on the high temperature metal nitride layer and a portion of the first surface of the active substrate.

6. The method of claim 5 wherein the step of forming first dielectric on the high temperature metal nitride layer and a portion of the first surface comprises forming a high thermal conductivity dielectric layer.

7. The method of claim 5 wherein the step of forming the interlayer on the high temperature metal nitride layer and a portion of the first surface further comprises forming a second dielectric layer on the first dielectric layer.

8. The method of claim 7 wherein the step of planarizing the interlayer comprises planarizing the first dielectric layer before the step of forming the second dielectric layer.

9. The method of claim 8 wherein the step of forming the first dielectric layer comprises depositing a first layer of PETEOS silicon oxide having a thickness on the order of 10,000 to 20,000 angstroms; wherein the step of annealing the first dielectric layer comprises annealing the first layer of PETEOS silicon oxide at approximately 1000° C. in an inert ambient having less than 3000 ppm of oxygen to prevent oxidation of the high temperature metal nitride layer; wherein the step of planarizing the first dielectric layer comprises removing approximately 5,000 to 15,000 angstroms of the first dielectric layer and mechanically cleaning the first dielectric layer with a secondary polishing pad absent polishing slurry; and wherein the step of forming the second dielectric layer comprises depositing a second layer of PETEOS silicon oxide having a thickness on the order of 5,000 to 15,000 angstroms.

10. The method of claim 1 wherein the step of developing the photoresist layer comprises developing the photoresist layer absent a photoresist hardening step before the step of etching the high temperature metal nitride layer, and wherein the step of etching the high temperature metal nitride layer comprises etching the high temperature metal nitride in a reactive ion etchant consisting essentially of chlorine.

11. The method of claim 1 wherein the step of depositing the photoresist layer comprises depositing a positive photoresist and the step of removing the photoresist layer using the non-oxidizing photoresist stripper comprises removing the photoresist layer with a stripper comprising n-methyl pyrrolidone having a basic pH.

12. The method of claim 11 wherein the step of removing the photoresist layer comprises the steps of:
 removing the photoresist layer in a first bath of n-methyl pyrrolidone maintained at a temperature of approximately 75° to 85° C.; and
 removing residual photoresist in a second bath of n-methyl pyrrolidone maintained at approximately 45° to 55° C.

13. The method of claim 1 further comprising the steps of:

forming a first and a second doped region of a second conductivity type extending from the first surface and having a surface concentration on the order of $3.0 \times 10^{19}$ atoms/cm$^3$ at the first surface;
 forming a third doped region of the first conductivity between the first and second doped regions extending from the first surface and having a surface concentration on order of $6.5 \times 10^{19}$ atoms/cm$^3$; and
 removing a portion of the second surface of the active substrate to thin the active substrate; and
 wherein the step of providing the active substrate of the first conductivity type comprises providing an n-type silicon substrate having a dopant concentration on the order of $1.0 \times 10^{15}$ to $3.0 \times 10^{16}$ atoms/cm$^3$, and wherein the step of forming the high temperature metal nitride layer comprises forming a titanium-nitride layer having a thickness on the order of 1000 to 3000 angstroms, and wherein the step of bonding the handle substrate to the first polycrystalline layer comprises bonding the handle substrate to the first polycrystalline semiconductor layer in steam at a temperature of approximately 1050° to 1250° C.

14. A method for forming a direct wafer bonded structure having a high temperature metal nitride buried layer and enhanced thermal conductivity comprising the steps of:
 providing an active substrate of a first conductivity type having a first and second surface;
 forming a high temperature metal nitride layer on the first surface of the active substrate, wherein the high temperature metal nitride is selected from the group consisting of titanium-nitride, vanadium-nitride, and tungsten nitride;
 depositing a photoresist layer on the high temperature metal nitride layer;
 selectively exposing the photoresist layer to light;
 developing the photoresist layer to selectively remove photoresist to form a pattern;
 etching the high temperature metal nitride layer to conform the high temperature metal nitride layer to the pattern in the photoresist layer;
 removing the remaining photoresist layer using a non-oxidizing photoresist stripper;
 forming a dielectric layer on the high temperature metal nitride layer and a portion of the first surface, wherein the dielectric layer adheres to the high temperature metal nitride layer during subsequent high temperature environments;
 annealing the first dielectric layer to reduce stresses in the first dielectric layer;
 forming a first polysilicon layer on the dielectric layer;
 planarizing the first polysilicon layer; and
 bonding a handle substrate to the first polysilicon layer.

15. The method of claim 14 further comprising the step of forming a second polysilicon layer on the dielectric layer before the step of forming the first polysilicon layer wherein the second polysilicon layer is of a thickness substantially thinner than thickness of the first polysilicon layer.

16. The method of claim 14 wherein the step of developing the photoresist layer comprises developing the photoresist layer absent a photoresist hardening step before the step of etching the high temperature metal nitride, and wherein the step of etching the high temperature metal nitride layer comprises etching the high temperature metal nitride in a reactive ion etchant consisting essentially of chlorine.

17. The method of claim 14 wherein the step of depositing the photoresist layer comprises depositing a positive photoresist and the step of removing the photoresist layer using the non-oxidizing photoresist stripper comprises removing the photoresist layer with a stripper comprising n-methyl pyrrolidone having a basic pH.

18. The method of claim 17 wherein the step of removing the photoresist layer comprises the steps of removing the photoresist layer in a first bath of n-methyl pyrrolidone maintained at a temperature of approximately 75° to 85° C. and removing residual photoresist in a second bath of n-methyl pyrrolidone maintained at approximately 45° to 55° C.

19. The method of claim 14 further comprising the steps of:
  forming a first and a second doped region of a second conductivity type extending from the first surface and having a surface concentration on the order of $3.0 \times 10^{19}$ atoms/cm$^3$ at the first surface;
  forming a third doped region of the first conductivity extending from the first surface between the first and second doped regions and having a surface concentration on the order of $6.5 \times 10^{19}$ atoms/cm$^3$ at the first surface; and
  removing a portion of the second surface of the active substrate to thin the active substrate; and
  wherein the step of providing the active substrate of the first conductivity type comprises providing an n-type silicon substrate having a <100> orientation and a dopant concentration on the order of $1.0 \times 10^{15}$ to $3.0 \times 10^{16}$ atoms/cm$^3$, and wherein the step of forming the high temperature metal nitride layer comprises forming a titanium-nitride layer having a thickness on the order of 1000 to 3000 angstroms; and wherein the step of annealing the dielectric layer comprises annealing the dielectric layer at approximately 1000° C. in an inert ambient having less than 3000 ppm of oxygen to prevent oxidation of the titanium-nitride layer; and wherein the step of forming the first polysilicon layer comprises forming the first polysilicon layer having a thickness on the order of 15 to 25 microns; and wherein the step of bonding the handle substrate to the first polysilicon layer comprises bonding the handle substrate to the first polysilicon layer in steam at a temperature of approximately 1050° to 1250° C.

* * * * *